United States Patent
Jeon et al.

(10) Patent No.: US 10,867,857 B2
(45) Date of Patent: Dec. 15, 2020

(54) METHOD OF CUTTING SUBSTRATE AND METHOD OF SINGULATING SEMICONDUCTOR CHIPS

(71) Applicant: SAMSUNG ELECTRONICS CO., LTD., Suwon-si (KR)

(72) Inventors: Chang-Seong Jeon, Yongin-si (KR); Seung-Hun Shin, Cheonan-si (KR); Jae-Kyung Yoo, Seoul (KR); Teak-Hoon Lee, Jung-Gu (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/539,980

(22) Filed: Aug. 13, 2019

(65) Prior Publication Data
US 2020/0098635 A1 Mar. 26, 2020

(30) Foreign Application Priority Data
Sep. 21, 2018 (KR) .......................... 10-2018-0114376

(51) Int. Cl.
*H01L 21/78* (2006.01)
*H01L 21/3065* (2006.01)
*H01L 21/56* (2006.01)
*H01L 21/308* (2006.01)
*H01L 21/683* (2006.01)

(52) U.S. Cl.
CPC ............ *H01L 21/78* (2013.01); *H01L 21/308* (2013.01); *H01L 21/3065* (2013.01); *H01L 21/56* (2013.01); *H01L 21/6836* (2013.01)

(58) Field of Classification Search
CPC ........................................................ H01L 21/78
See application file for complete search history.

(56) References Cited

U.S. PATENT DOCUMENTS

| | | |
|---|---|---|
| 6,465,158 B1 | 10/2002 | Sekiya |
| 8,158,494 B2 | 4/2012 | Haji et al. |
| 8,288,284 B2 | 10/2012 | Arita et al. |
| 8,754,532 B2 | 6/2014 | Tsumura et al. |
| 9,633,902 B2 | 4/2017 | Matsui et al. |
| 9,847,258 B2 | 12/2017 | Rohleder et al. |
| 9,887,091 B2 | 2/2018 | Suzuki |
| 9,911,654 B2 | 3/2018 | Martinez et al. |
| 9,972,575 B2 | 5/2018 | Park et al. |
| 2017/0004977 A1* | 1/2017 | Hu .................... H01L 21/31127 |

\* cited by examiner

*Primary Examiner* — Yu-Hsi D Sun
(74) *Attorney, Agent, or Firm* — Volentine, Whitt & Francos, PLLC

(57) ABSTRACT

A method of cutting a substrate including a device region and a scribe lane region includes selectively forming a passivation layer in the device region of the substrate, selectively forming a self-assembled monolayer on the passivation layer, and performing plasma cutting in the scribe lane region.

14 Claims, 13 Drawing Sheets

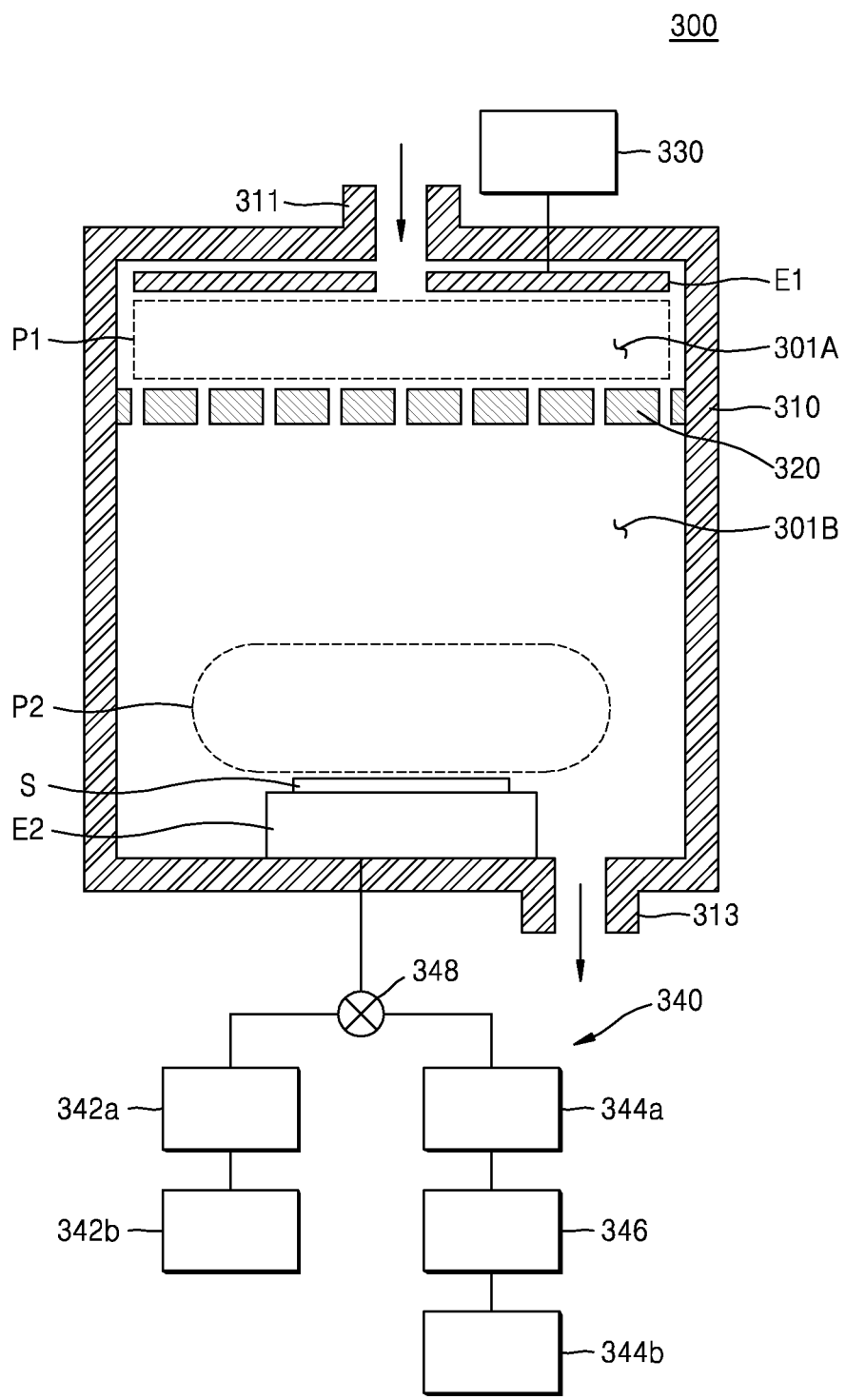

METHOD OF CUTTING SUBSTRATE AND METHOD OF SINGULATING SEMICONDUCTOR CHIPS

PRIORITY STATEMENT

This application claims the benefit of Korean Patent Application No. 10-2018-0114376, filed on Sep. 21, 2018, in the Korean Intellectual Property Office, the disclosure of which is hereby incorporated by reference in its entirety.

BACKGROUND

The inventive concept relates to a method of cutting a substrate and to a method of singulating a substrate into semiconductor chips. More particularly, the inventive concept relates to a method of plasma etching a substrate and to a plasma dicing method of singulating a substrate into dies.

Semiconductor chips are used in electronic products to perform such functions as storing and processing data. Demands for miniaturizing electronic products lead to a need for manufacturing thinner semiconductor chips. Semiconductor chips may be mass-produced by forming like or identical devices, e.g., integrated circuits, on a wafer and then separating the wafer into chips each of which includes a device. The latter process may be referred to as singulation. The manufacturing of thin semiconductor chips thus requires improvements in existing singulation methods for dividing a processed wafer into semiconductor chips.

SUMMARY

According to an aspect of the inventive concept, there is provided a method of cutting a substrate having device regions and a scribe lane region separating the device regions from one another, the method comprising forming a passivation layer on the substrate selectively so as to cover the device regions of the substrate but not the scribe lane region, forming a self-assembled monolayer over the passivation layer, and cutting into the scribe lane region of the substrate using a plasma.

According to another aspect of the inventive concept, there is provided a method of singulating a substrate having device regions and a scribe lane region separating the device regions from one another, the method comprising forming a passivation layer on the substrate selectively so as to cover the device regions of the substrate but not the scribe lane region, forming in the scribe lane region a recess having a V-shaped cross section by cutting the scribe lane region using a plasma, attaching a dicing tape to the substrate, and applying a tensile force to the dicing tape until a separation between adjacent ones of the device regions at opposite sides of the recess occurs.

According to another aspect of the inventive concept, there is provided a method of cutting a substrate having device regions and a scribe lane region separating the device regions from one another, the method comprising forming a passivation layer on the substrate selectively so as to cover the device regions of the substrate but not the scribe lane region by forming an initial un-activated layer of passivation material and subsequently activating the passivation material, forming a self-assembled monolayer over the passivation layer, and forming a recess in the scribe lane region by deep reactive ion etching (DRIE), wherein the DRIE is terminated before the recess extends through the substrate such that at least a part of the scribe lane region of the substrate remains.

According to another aspect of the inventive concept, there is provided a singulation method in forming semiconductor chips, the method comprising providing a substrate having device regions and a scribe lane region separating the device regions from each other, forming a passivation layer selectively on the substrate so as to cover the device regions of the substrate but not the scribe lane region, and cutting the scribe lane region using a plasma to form a recess in the scribe lane region. The substrate includes a semiconductor substrate, an insulating layer on the semiconductor substrate, a metal interconnection on the insulating layer and extending across the scribe lane region into two of the device regions on opposite sides of the scribe lane region, and a layer disposed on and insulating the metal interconnection. The cutting of the scribe lane region is terminated before the recess being formed by the cutting reaches the metal interconnection, whereby the two device regions remain connected to each other by structure comprising part of the insulating layer, the metal interconnection and part of the layer disposed on and insulating the metal interconnection. Subsequently, a tensile force is applied to the structure that severs the metal interconnection.

BRIEF DESCRIPTION OF THE DRAWINGS

The inventive concept will be more clearly understood from the following detailed description of examples thereof, taken in conjunction with the accompanying drawings in which:

FIG. 9 is a schematic diagram of a plasma treatment device in which the plasma cutting illustrated in FIGS. 8A through 8G may be performed;

DETAILED DESCRIPTION

Figure 1:
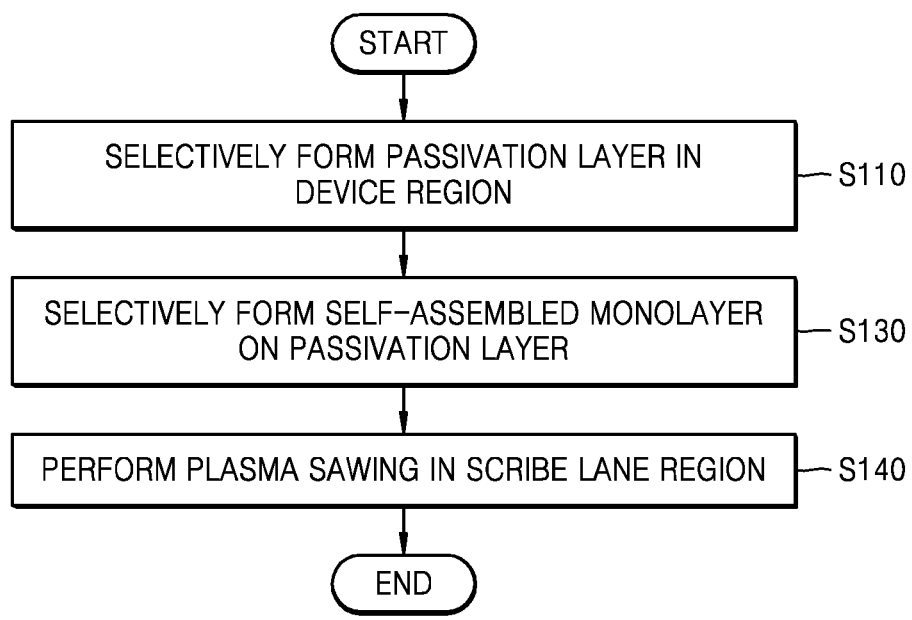
FIG. 1 is a flowchart illustrating an example of a method of cutting a substrate according to an embodiment of the inventive concept.

Hereinafter, examples of the inventive concept will be described in detail with reference to the accompanying drawings. Like components will be designated by like reference numerals throughout the drawings, and will not be described repeatedly in the detailed description.

FIG. 1 is a flowchart illustrating a general method of cutting a substrate according to an embodiment of the inventive concept. FIGS. 2A through 2F illustrate a substrate during the course of the method according to an embodiment of the inventive concept.

Figure 2A:
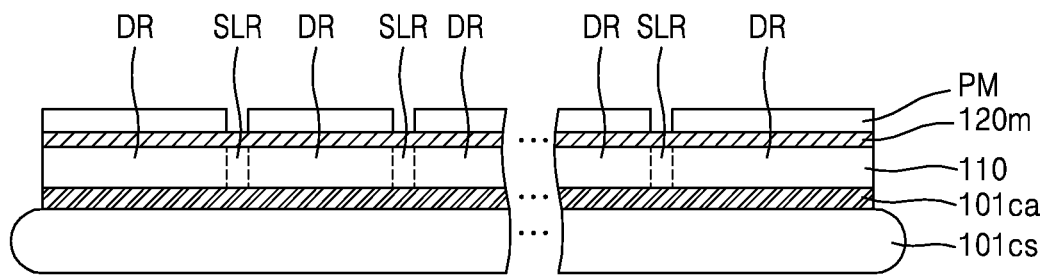
FIGS. 2A, 2B, 2C, 2D, 2E and 2F are cross-sectional views of a substrate illustrating an example of a method of cutting the substrate according to an embodiment of the inventive concept.

Referring to FIGS. 1 and 2A, a substrate 110 having a device region DR and a scribe lane region SLR is provided.

Figure 5:
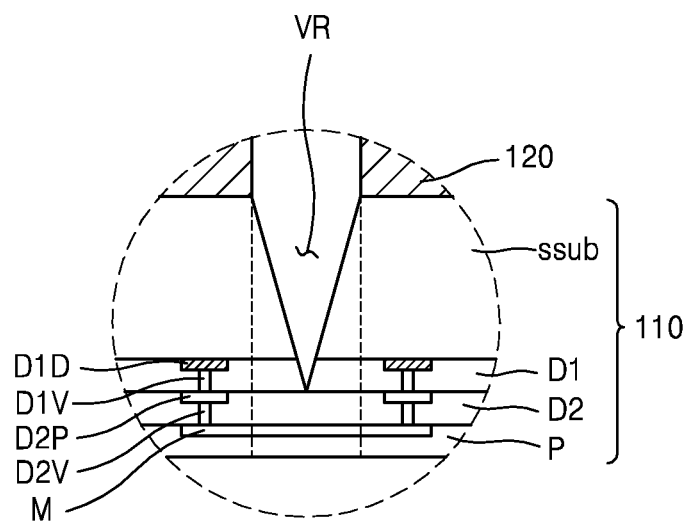
FIG. 5 is an enlarged view of a portion V of the structure of the device under manufacture in FIG. 2E.

The substrate 110 may include a layer of semiconductor material, e.g., an IV-group semiconductor, an III-V-group compound semiconductor, or an II-VI-group oxide semiconductor. Examples of the IV-group semiconductor are silicon, germanium, and silicon-germanium. The semiconductor material of the substrate 110 may be provided as a bulk wafer or may comprise an epitaxial layer. The substrate 110 may comprise a silicon-on-insulator (SOI) substrate, a gallium arsenide (GaAs) substrate, or a silicon germanium substrate, That is, the substrate 110 may include a semiconductor substrate ssub (FIG. 5). The substrate 110 may comprise a ceramic substrate, a quartz substrate, or a glass substrate for use in a display or the like.

Unit devices D1D (see FIG. 5), such as various types of active or passive components of a semiconductor device, may be formed in the device region DR of the substrate 110. A device isolating layer for isolating the unit devices and/or an interlayer insulating layer D1 (see FIG. 5) may also be formed in the device region DR. The device isolating layer may be formed by a local oxidation of silicon (LOCOS) process or shallow trench isolation (STI) process, for example. The interlayer insulating layer D1 may cover the unit devices. Conductive regions electrically connected to the unit devices D1 through the interlayer insulating layer D1 may also be formed in the device region DR of the substrate 110. Conductive lines (not shown) may also be formed to connect the unit devices or the conductive regions with one another.

Features such as a test element group (TEG), an alignment mask, or the like may be provided in the scribe lane regions SLR of the substrate 110. The scribe lane region SLR is to be at least partially removed by a singulation process. Accordingly, features and electronic components that are used in performing the operations of a semiconductor device in its end use, i.e., the operations other than those associated with the testing or manufacturing of the device, are formed/situated in the device region DR not in the scribe lane region SLR.

A passivation material layer 120m may be provided on a surface of the substrate 110. The passivation material layer 120m may include a layer/films of silicon nitride and/or a silicon oxide, without being limited thereto. In some examples, the passivation material layer 120m is a single layer of material (i.e., is a monolayer) whereas in other examples the passivation material layer 120m is multi-layered (i.e., has two or more stacked films of materials).

In some examples, the surface on which the passivation material layer 120m is provided is a surface opposite to an active surface of the substrate 110. In other examples, the surface on which the passivation material layer 120m is provided is an active surface of the substrate 110 or a surface close to the active surface.

The passivation material layer 120m may be formed using physical vapor deposition (PVD), chemical vapor deposition (CVD), atomic layer deposition (ALD), or the like. However, the inventive concept is not limited to the foregoing examples.

A photoresist mask PM may be provided on the passivation material layer 120m for patterning the passivation material layer 120m. The photoresist mask PM may be formed by coating the substrate 110 with a photoresist, exposing the resulting layer of photoresist, and then developing the exposed layer of photoresist. The photoresist mask PM may comprise a negative photoresist, positive photoresist, or negative tone photoresist, without being limited thereto.

The substrate 110 may be attached to a carrier substrate 101cs for ease of handling.

The carrier substrate 101cs may be a substrate of silicon (e.g., a blank device wafer), soda lime glass, borosilicate glass, silicon carbide, silicon germanium, silicon nitride, gallium arsenic, sapphire, or various metals or ceramics. However, the inventive concept is not limited to the foregoing examples.

The carrier substrate 101cs has sufficient thickness and strength for supporting the substrate 110 during handling of the substrate 110.

The substrate 110 and the carrier substrate 101cs may be coupled by an adhesive material 101ca. The adhesive material 101ca may be an adhesive paste, film or glue, but is not specially limited. In some examples, the adhesive material 101ca is an epoxy-based resin, a silicone-based resin, or a polysiloxane-based resin, but is not specially limited.

Figure 2B:
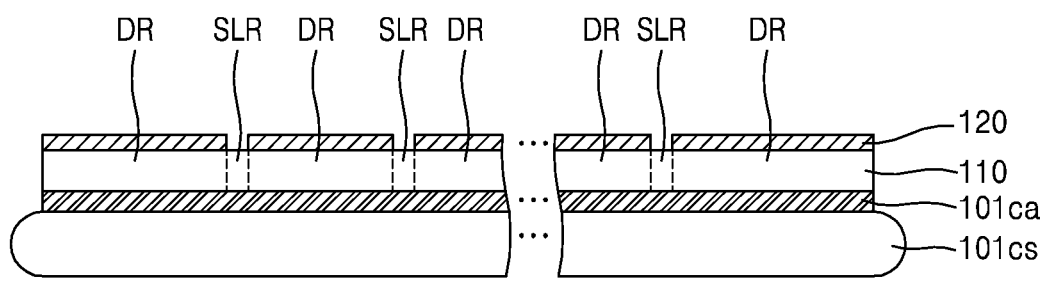

Referring to FIGS. 1 and 2B, the passivation material layer 120m is patterned using the photoresist mask PM as an etch mask, thus selectively forming the passivation layer 120 in the device region DR in operation S110.

The patterning may be performed by anisotropic etching, e.g., ion-beam etching, radio frequency (RF) sputter etching, chemical reaction dry etching, or reactive ion etching using an ion beam, an electron beam, or photonic radiation. However, the inventive concept is not limited to the foregoing examples.

Figure 2C:
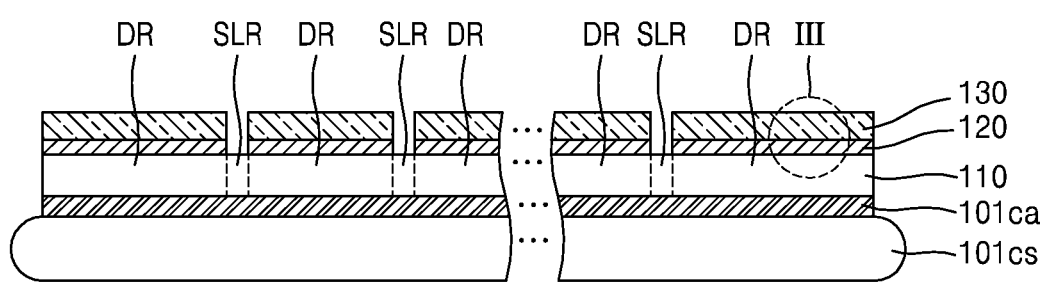

Referring to FIGS. 1 and 2C, a self-assembled monolayer (SAM) 130 is selectively formed on the passivation layer 120 in operation S130.

The self-assembled monolayer 130 may be uniformly formed on the passivation layer 120 by dispensing a solution in which self-assembled molecules of the self-assembled monolayer 130 are dispersed on the passivation layer 120.

Figure 3:
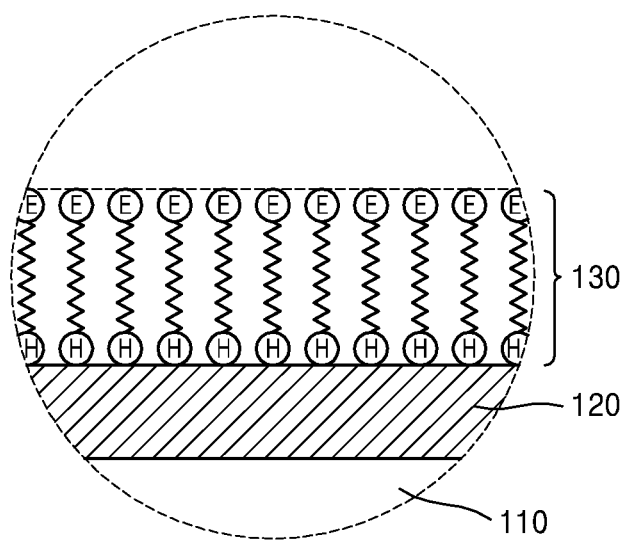
FIG. 3 is a conceptual diagram of an enlarged side portion III of the device under manufacture in FIG. 2C.

FIG. 3 illustrates conceptually an enlargement of portion III in FIG. 2C.

Referring to FIG. 3, the self-assembled monolayer 130 may be a layer in which self-assembled molecules (SAm) are packed side-by-side. Although FIG. 3 illustrates that the self-assembled molecules (SAm) are packed densely and at specific intervals, they may have a local vacancy.

Each self-assembled molecule (SAm) may include a head group H, an end group E, and a backbone therebetween.

The head group H may be a functional group capable of achieving chemisorption or chemical covalent bonding with the passivation layer 120, e.g., one or more functional groups selected from the group consisting of a thiol group (—SH), a silanol group (—SiH$_{3-x}$(OH)$_x$) where x is an integer from 1 to 3, a halogen element, a hydroxy group (—OH), a phosphoric acid group (—PO$_4$), an alkenyl group having a carbon number of 2 to 6, a dihydroxyphenyl group ($-C_6H_3(OH)_2$), and a carboxylic acid group ($-COOH$).

The backbone may include a hydrocarbon or a silane.

In an examples in which the backbone includes a hydrocarbon, the backbone is a chain-shaped hydrocarbon having a main chain with a carbon number of 3 to 1000. The hydrocarbon may further include a side chain.

In an example in which the backbone includes a silane, the silane has a polysilyl form in which silicon atoms are connected in a chain shape like $-(SiH_2)_n-$ wherein n is an integer of 3 to 500.

The end group E may be a functional group that is determined by characteristics to be imparted to a free surface of the self-assembled monolayer 130. For example, the end group E is a functional group designed to impart hydrophilicity to the free surface of the self-assembled monolayer 130, e.g., the end group E may be a hydroxyl group ($-OH$) or a carboxyl group ($-COOH$). In another example, the end group E is a functional group designed to impart hydrophobicity to the free surface of the self-assembled monolayer 130, e.g., the end group E may be a non-polar alkyl group (e.g., a methyl group ($-CH_3$) or an ethyl group ($-C_2H_5$)) or an alkenyl group (e.g., an ethylenyl group ($-CH=CH_2$)).

In examples in which there is no special characteristic to be imparted to the free surface of the self-assembled monolayer 130, the self-assembled molecule SAm may end with an atom group of the same type as that of the backbone. For example, when the backbone includes hydrocarbon, the end group E may be a methyl group ($-CH_3$). When the backbone includes a polysilyl group, the end group E may be a silane group ($-SH_3$).

The head group H of the self-assembled molecule SAm may have affinity with or reactivity to the passivation layer 120. When the head group H has affinity with the passivation layer 120, the head group H may exhibit a chemisorption with the passivation layer 120. When the head group H has reactivity with the passivation layer 120, the head group H may form a chemical covalent bond with the passivation layer 120.

Because the passivation layer 120 is not formed in the scribe lane region SLR, the self-assembled monolayer 130 will not be substantially formed in the scribe lane region SLR. Here, when it is said that the self-assembled monolayer 130 is not "substantially" formed in the scribe lane region SLR, it means that the self-assembled molecule SAm is absent from the scribe lane region SLR or only exists weakly in the scribe lane region SLR.

In some examples, the self-assembled monolayer 130 may be formed on the passivation layer 120 with a selectivity greater than about 5:1, e.g., greater than 10:1, 20:1, 30:1, 50:1, 100:1, 300:1, 500:1, or 1000:1 with respect to the scribe lane region SLR. A selectivity of N:1 with respect to the self-assembled monolayer 130 on the passivation layer 120 means that when one self-assembled molecule (SAm) exhibits chemisorption or forms a covalent bond on the scribe lane region SLR, N self-assembled molecules SAm facilitate chemisorption with or form covalent bonds on the passivation layer 120.

Figure 2D:
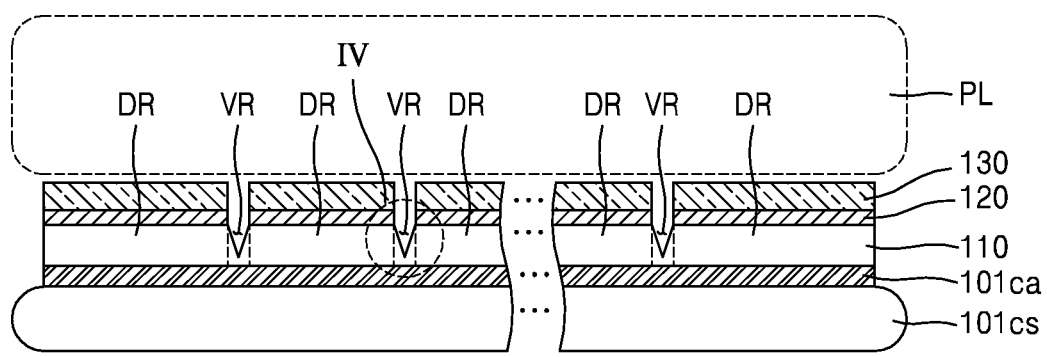

Referring to FIGS. 1 and 2D, plasma cutting is performed on the exposed scribe lane region SLR, i.e., the region not covered with the self-assembled monolayer 130, in operation S140.

The plasma cutting may be performed by a plasma etching process. In some examples, the plasma etching process is DRIE such as a Bosch process.

In the scribe lane region SLR, a recess VR having a V-shaped cross section may be formed by plasma cutting.

Figure 4A:
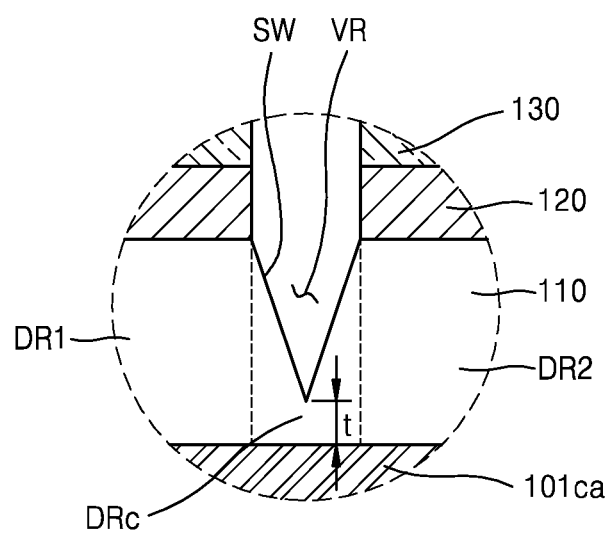
FIGS. 4A and 4B are enlarged views of respective versions of a portion IV of the device under manufacture in FIG. 2D.

FIG. 4A is an enlarged view of a portion IV in FIG. 2D.

Referring to FIG. 4A, a side SW of the recess VR between two device regions, that is, a first device region DR1 and a second device region DR2 may be inclined with respect to a top surface of the substrate 110, and may be defined by a smooth surface. The width of the recess VR between the first device region DR1 and the second device region DR2 may decrease in a direction away from the passivation layer 120. In other words, the recess VR may taper in a direction away from the passivation layer 120.

In some examples, the first device region DR1 and the second device region DR2 are not be completely isolated from each other by the recess VR. In other words, the first device region DR1 and the second device region DR2 may be physically connected to each other by a residual region DRc of the substrate 110 under the recess VR.

The scribe lane region SLR between the first device region DR1 and the second device region DR2 may contain (see FIG. 5) parts of a semiconductor substrate ssub, several interlayer insulating layers D1, D2, for example, on the semiconductor substrate ssub, and a metal interconnection M (see FIG. 5) traversing the scribe lane region SLR. The recess VR may be formed by the plasma cutting. The part of the semiconductor substrate ssub remaining in the scribe lane region SLR is illustrated as having a thickness t.

Figure 4B:
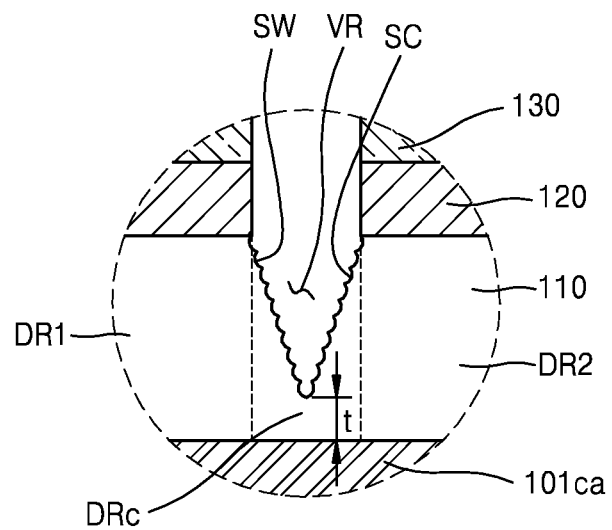

FIG. 4B is an enlarged view of a portion IV in FIG. 2D in another version of the method according to an embodiment of the inventive concept. The example illustrated in FIG. 4B is the same as that illustrated in FIG. 4A except that scallops SC are formed are the sides SW of the recess VR.

Referring to FIG. 4B, the scallops SC may be a structure resulting from the Bosch process. The scallops SC are concave surfaces connected along each side SW of the recess. Furthermore, although FIGS. 4A and 4B illustrate that the bottom of the recess VR has a V-shaped cross section, the inventive concept is not limited thereto. In some examples, the recess VR may have inclined sides SW (sides that are oblique with respect to the top surface of the substrate 110) but a substantially flat bottom. In this case, the recess VR may have a trapezoidal cross section with a larger top width than a bottom width.

A method of forming the recess VR having the inclined sides using the Bosch process will be described later in more detail with reference to FIGS. 8A through 8G.

Figure 2E:
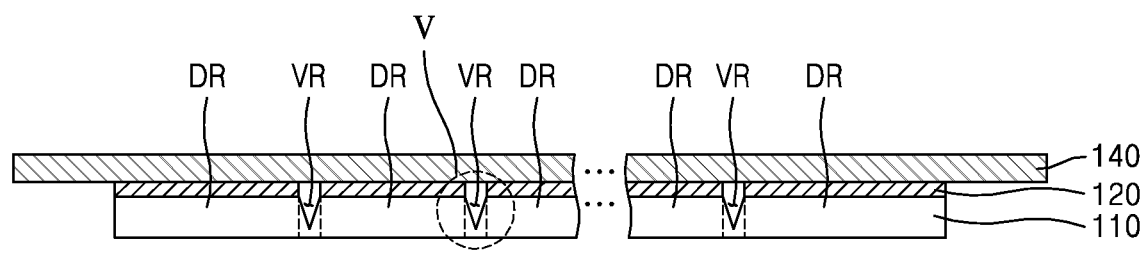

Referring to FIGS. 1 and 2E, the self-assembled monolayer 130 may be removed. In examples in which the self-assembled monolayer 130 is a carbon organic compound or a silicon compound, the self-assembled monolayer 130 may be removed through an ashing process using $O_2$ or a dissolution process using tetramethyl orthosilicate (TMAH) or a solution such as diluted hydrofluoric acid (HF).

Next, a dicing tape 140 may be attached onto the passivation layer 120. The dicing tape 140 has elasticity and may lose adhesive property when subjected to heat or ultraviolet (UV) rays. The dicing tape 140 may be, but is not specially limited to, a tape in which a coating of a (meth)acryl-based copolymer or an energy-beam-curable compound with a carbon-carbon double bond is provided on a base substrate including alkyl (meth)acrylate-based resin, (meth)acrylate alkyl ester-based resin, polypropylene, a styrene-butadiene copolymer, low-density polyethylene, very low-density polyethylene, or a combination of at least two of such substances.

After the dicing tape 140 is attached, the adhesive material 101ca and the carrier substrate 101cs may be removed from the substrate 110.

Figure 2F:
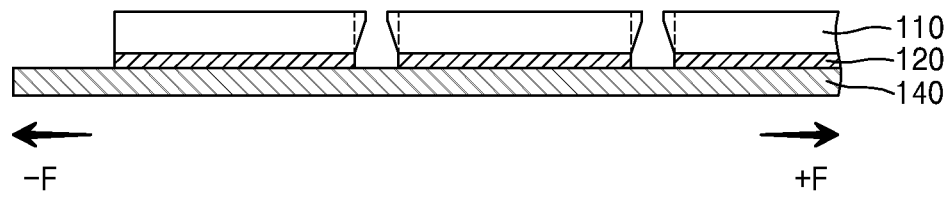

Referring to FIGS. 1 and 2F, a tensile force +F and −F is applied in the horizontal direction with respect to the dicing tape 140, to complete the singulating of the substrate 110 into individual dies.

FIG. 5, as was referred to above, is an enlarged view of portion V in FIG. 2E.

Referring to FIG. 5, the unit devices D1D are formed in the device region DR on the semiconductor substrate ssub of the substrate 110 and may be insulated by the first interlayer insulating layer D1. The device region DR may include various types of electronic components (active and/or passive) depending on the type of unit devices being fabricated. Examples of active electronic components are transistors and diodes and examples of passive electronic components are capacitors and resistors. The electronic components in the device region DR may constitute at least one of a system large scale integration (LSI), a logic circuit, an image sensor such as complementary metal oxide semiconductor (CMOS) image sensor, a memory device such as a flash memory, a dynamic random access memory (DRAM), a static random access memory (SRAM), an electrically erasable and programmable ROM (EEPROM), a programmable RAM (RAM), a magnetic RAM (MRAM), a resistance RAM (ReRAM), a high bandwidth memory (HBM), and a hybrid memory cubic (HMB), or may constitute a microelectromechanical system (MEMS) device.

The unit device D1D may be connected with a pad D2P in another layer through a first via MN extending through the first interlayer insulating layer D1. While one first interlayer insulating layer D1 is illustrated in FIG. 5, two or more first interlayer insulating layers D1 may be provided.

The pad D2P may be insulated by a second interlayer insulating layer D2. The pad D2P may be connected with the metal interconnection M in another layer through a second via D2V extending through the second interlayer insulating layer D2. The metal interconnection M may be insulated by a passivation layer P.

The first via MN and the second via D2V may include a material that is the same as or is different from that of the metal interconnection M. The metal interconnection M, the first via MN, and the second via D2V may include a central portion of metal forming an electrically conductive path and at least one barrier metal layer that encloses the central portion and prevents the metal thereof from diffusing into the surrounding layers.

The central portion of metal may include one or more metals selected from group consisting of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), white gold (Pt), rhodium (Rh), rhenium (Re), ruthenium (Ru), tantalum (Ta), tellurium (Te), titanium (Ti), tungsten (W), zinc (Zn), and zirconium (Zr). The barrier metal layer may include a stacked structure of one or more materials selected from the group consisting of titanium (Ti), tantalum (Ta), titanium nitride (TiN), and tantalum nitride (TaN).

As illustrated in FIG. 5, the metal interconnection M extends across a scribe lane region between two device regions.

If the plasma cutting were performed in the scribe lane region until the semiconductor substrate ssub, the first interlayer insulating layer D1, and the second interlayer insulating layer D2 were removed but the metal interconnection M was left, upon application of the tensile force +F and −F, the metal interconnection M could elongate in its longitudinal direction due to its ductility before separating, at which time a large amount of metal particles would be produced. Furthermore, in some cases, the metal interconnection M, depending on characteristics thereof, could elongate without being cut by the application of the tensile force, i.e., the singulation process would fail.

On the other hand, according to an aspect of the inventive concept, a part of the substrate 110 other than the metal interconnection M remains at the end of the plasma cutting process as illustrated in FIG. 5, e.g., when one or more of the semiconductor substrate ssub, the first interlayer insulating layer D1, and the second interlayer insulating layer D2 and the passivation layer P remain. As a result, a frictional force between the metal interconnection M and another layer (e.g., the passivation layer P and/or the second interlayer insulating layer D2) directly acts on the metal interconnection M upon application of the tensile force +F and −F, allowing the metal interconnection M to elongate and to be cut without producing particles. Moreover, the surrounding layers may act to directly cut the metal interconnection M, thereby preventing the singulation process from failing as described above.

Figure 6:
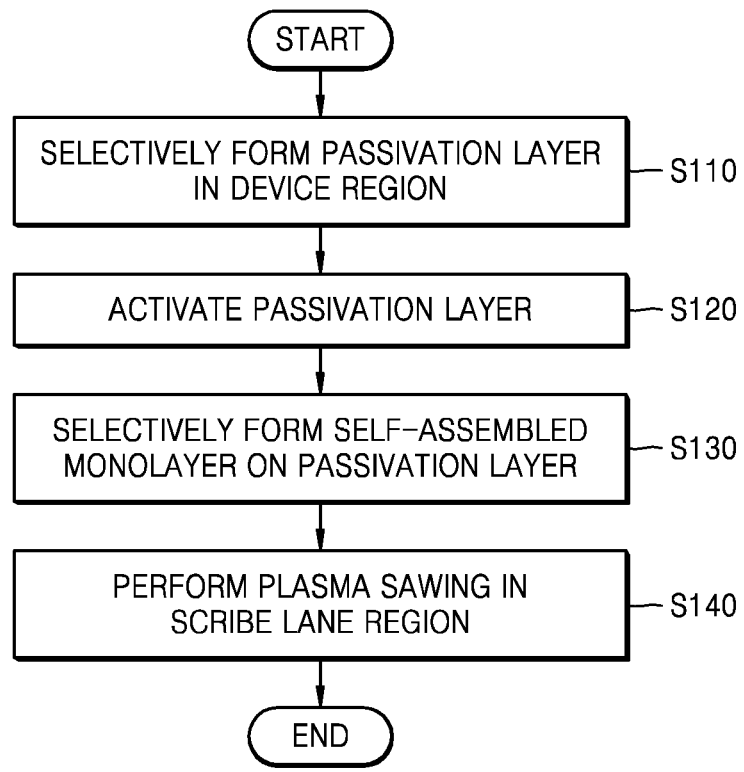
FIG. 6 is a flowchart illustrating another example of a method of cutting a substrate according to an embodiment of the inventive concept.

By using the method of cutting the substrate and method of singulating a semiconductor chip according to an embodiment of the inventive concept, a high-reliability semiconductor chip may be manufactured in a simple and inexpensive manner FIG. 6 is a flowchart illustrating a method of cutting a substrate according to another embodiment of the inventive concept.

Referring to FIG. 6, operation S110 of selectively forming the passivation layer 120 in the device region DR, operation S130 of selectively forming the self-assembled monolayer 130 on the passivation layer 120, and operation S140 of performing plasma cutting with respect to the scribe lane region are similar to those operations described with reference to FIGS. 1 through 2F, and thus will not be described again in detail.

The example illustrated in FIG. 6 is different from the embodiment described with reference to FIGS. 1 through 2F in that the passivation layer is formed by forming an initial un-activated layer of passivation material and then activating the material before the self-assembled monolayer 130 is formed.

Figure 7:
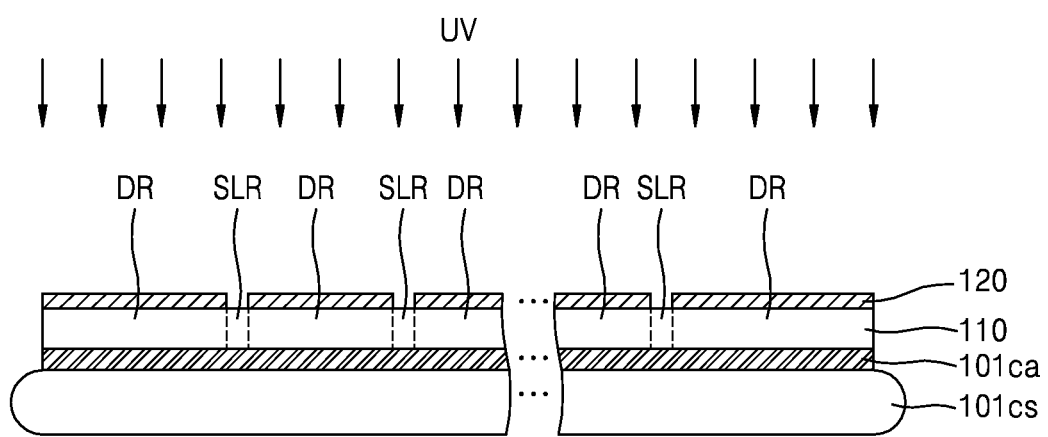
FIG. 7 is a cross-sectional view of a substrate during a stage of activating a passivation layer in the method of FIG. 6.

FIG. 7 is a cross-sectional view illustrating operation S120 in FIG. 6 of activating the material to form or finalize the forming of the passivation layer 120.

Referring to FIGS. 6 and 7, an activation process is performed with respect to the passivation layer (see FIG. 2B) patterned using a photolithography method. The activation process may increase a difference between hydrophobicity of the exposed scribe lane region SLR and hydrophilicity of the passivation layer 120.

In some examples, when the exposed scribe lane region SLR is hydrophobic and the passivation layer 120 is hydrophilic, the activation process causes the scribe lane region SLR to be more hydrophobic and/or the passivation layer 120 to be more hydrophilic. In some examples, the activation process increases a difference between the hydrophobicity of the exposed scribe lane region SLR and the hydrophilicity of the passivation layer 120 by significantly increasing the hydrophilicity of the passivation layer 120 while slightly reducing the hydrophobicity of the scribe lane region SLR. In some examples, the activation process increases a difference between the hydrophobicity of the scribe lane region SLR and the hydrophilicity of the passivation layer 120 by significantly increasing the hydrophobicity of the scribe lane region SLR while slightly reducing the hydrophilicity of the passivation layer 120.

In other examples, when the exposed scribe lane region SLR is hydrophilic and the passivation layer 120 is hydrophobic, the activation process causes the scribe lane region SLR to be more hydrophilic and/or the passivation layer 120 to be more hydrophobic. In some examples, the activation process increases a difference between the hydrophilicity of the scribe lane region SLR and the hydrophobicity of the passivation layer 120 by significantly increasing the hydrophobicity of the passivation layer 120 while slightly reducing the hydrophilicity of the scribe lane region SLR. In some examples, the activation process increases a difference between the hydrophilicity of the scribe lane region SLR and the hydrophobicity of the passivation layer 120 by significantly increasing the hydrophilicity of the scribe lane region SLR while slightly reducing the hydrophobicity of the passivation layer 120.

By increasing the difference between the hydrophilicity of the scribe lane region SLR and the hydrophobicity of the passivation layer 120, a selectivity with respect to the self-assembled molecules SAm may be increased in a subsequent process of forming the self-assembled monolayer 130. The selectivity with respect to the self-assembled molecules SAm has been described with reference to FIG. 3, and thus will not be described again in detail.

The activation process may be, for example, a plasma treatment, an exposure to ultraviolet (UV) radiation, radiation (infrared) exposure, polyol impregnation, or a combination of two or more of such processes.

In an examples in which the activation process is a UV radiation process (the irradiating of the passivation layer 120 with UV rays), the density of the active functional group such as a hydroxy group (—OH) on the passivation layer 120 increases such that the hydrophilicity of the passivation layer 120 increases.

The subsequent processes are similar to those described with reference to FIGS. 1 and 2C through 2F, and thus will not be described again in detail.

FIGS. 8A through 8G illustrate plasma cutting performed using DRIE (a Bosch process) to form a recess having inclined sides defined by scalloped surfaces.

Figure 8A:
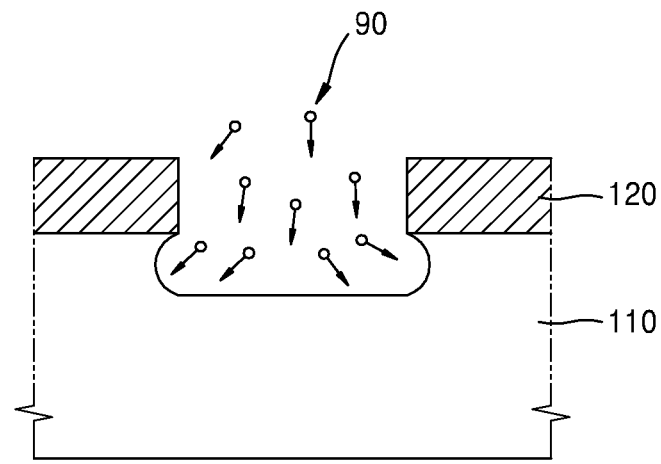
FIGS. 8A, 8B, 8C, 8D, 8E, 8F and 8G are cross-sectional views of a region of a device under manufacture sequentially illustrating deep reactive ion etching (DRIE) phases of a plasma cutting method according to an embodiment of the inventive concept.

Referring to FIG. 8A, the substrate 110 is etched using the passivation layer 120 as an etch mask. As an etch gas 90 comprising $SF_6$, $NF_3$, $XeF_2$, $F_2$, $CF_4$, HBr, $Cl_2$, $ClF_3$, or HF may be used. The etch gas 90 may be plasma-excited in various ways for reacting with the substrate 110, such that a pattern of the passivation layer 120 may be transcribed to the substrate 110.

Figure 8B:
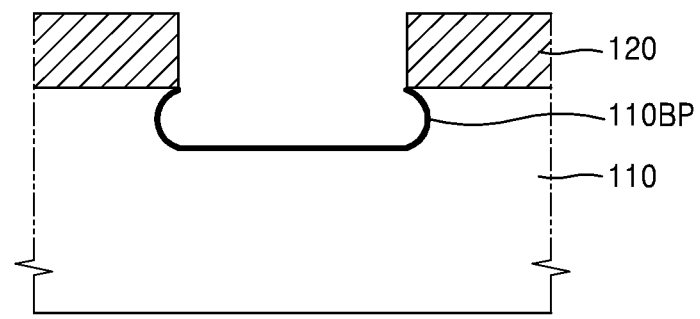

Referring to FIG. 8B, a protective layer 110BP is formed using a suitable precursor. To form the protective layer 110BPa fluorocarbon ($C_xF_y$)-based precursor, for example, may be plasma-excited and deposited on the entire surface. For example, $C_2F_6$, $C_3F_8$, $CHF_3$, $CH_2F_2$, or $C_4F_8$ is used as the fluorocarbon-based precursor. The depositing of the fluorocarbon-based precursor on the surface defining the opening etched into the substrate may conformally form a polytetrafluoroethylene (PTFE)-based polymer on the surface defining the opening.

Figure 8C:
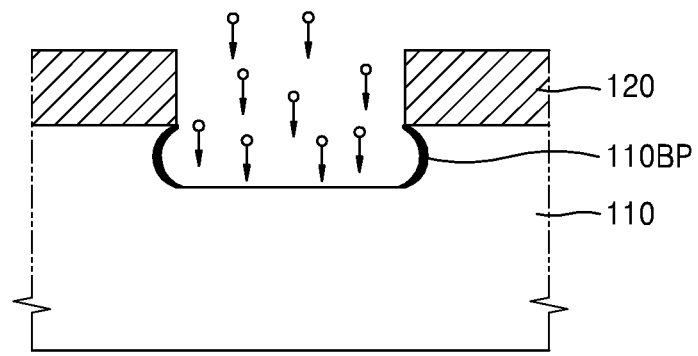

Referring to FIG. 8C, a portion of the protective layer 110BP may be removed by providing the plasma of the etch gas 90 with directivity normal to the upper surface of the substrate. The directivity may be produced by applying bias to the substrate 110. Because the protective layer 110BP is partially etched by the etch gas 90 having directivity, the portion of the protective layer 110BP formed on the sides of the opening is not removed, whereas the portion of the protective layer 110BP on a horizontal plane (i.e., a bottom surface) is removed by physical sputtering.

Figure 8D:
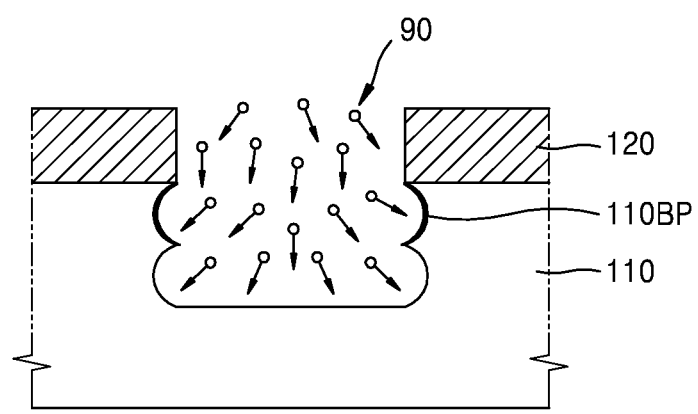

Referring to FIG. 8D, the substrate 110 is etched under the same process conditions as those of the stage shown in and described with reference to FIG. 8A. Then, portions covered by the passivation layer 120 and the protective layer 110BP on the sides of the opening are not etched, and an exposed bottom portion is further etched.

Figure 8E:
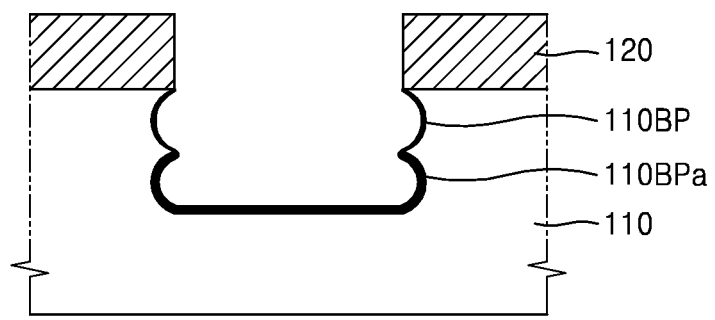

Referring to FIG. 8E, a protective layer 110BPa is formed using a suitable precursor. In this case, the protective layer 110BPa may be formed for a longer time than when forming the protective layer 110BP in the stage described with reference to FIG. 8B. As a result, the thickness of the protective layer 110BPa may be greater than that of the protective layer 110BP.

Figure 8F:
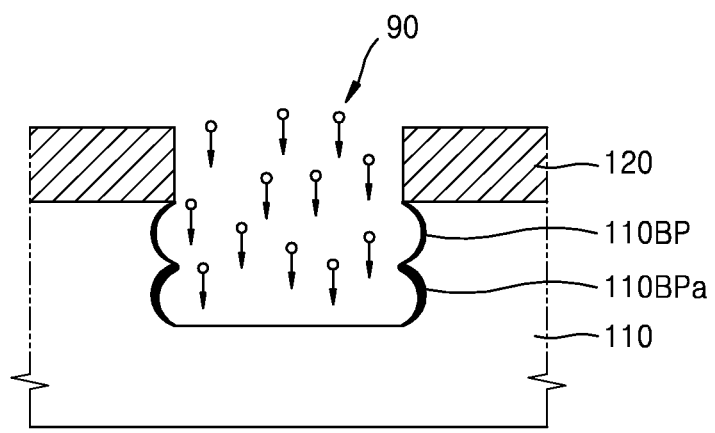

Referring to FIG. 8F, a portion of the protective layer 110BPa may be removed by imparting directivity to plasma of the etch gas 90. That is, by applying bias to the substrate 110 as in the stage described with reference to FIG. 8C, the protective layers 110BP and 110BPa parts formed on the sides of the opening are not removed, and the protective layer 110BPa part on the horizontal plane (i.e., the bottom surface) is removed by physical sputtering.

Figure 8G:
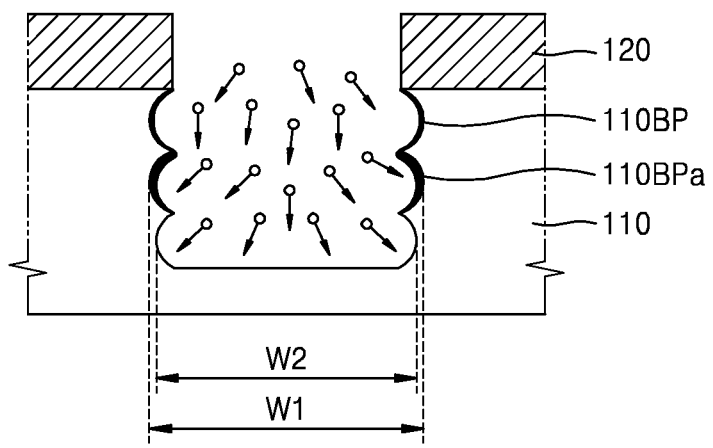

Referring to FIG. 8G, the substrate 110 is etched under the same processes as those in the stage shown in and described with reference to FIG. 8D. Because the protective layer 110BPa on the sides of the opening is thicker than that of the protective layer 110BP, a width W2 of a newly etched portion may be smaller than a width W1 of the etched portion in the stage described with reference to FIG. 8D.

By repeating the foregoing process, a recess having inclined opposite sides may be obtained. In some examples, the process is carried out to a specific depth such that a recess having inclined opposite sides and a flat bottom is obtained. In some examples, a recess having a V-shape cross section is obtained by carrying out the process until the opposite sides of the recess meet.

FIG. 9 illustrates a plasma treatment device 300 in which the plasma cutting process illustrated in FIGS. 8A through 8G may be performed.

Referring to FIG. 9, the plasma treatment device 300 includes a treating chamber 310, a first electrode E1 and a second electrode E2 inside the treating chamber 310, a first plasma generating device 330 configured to supply a high-frequency signal to the first electrode E1, and a second plasma generating device 340 configured to supply a signal to the second electrode E2.

In some examples, the plasma treatment device 300 is specifically configured to execute a DRIE process.

The treating chamber 310 may have, for example, a cylindrical shape and include a first space 301A and a second space 301B therein. An inner space of the treating chamber 310 may be divided into the first space 301A and the second space 301B by a shower head 320. An inner wall of the treating chamber 310 may be formed of a material such as quartz or yttria ($Y_2O_3$).

An inlet 311 into which a treating gas is introduced may be provided on an upper portion of the treating chamber 310. The treating gas may flow to the first space 301A through the inlet 311.

In the first space 301A, plasma generated by the first plasma generating device 330 may flow toward the shower head 320. Although a direct scheme is illustrated in FIG. 1 where the first plasma generating device 330 directly generates plasma in the first space 301A, the apparatus 300 may instead have a remote plasma source for generating plasma and connected to the first space 301A for introducing plasma into the treating chamber 310.

The first plasma generating device 330 may include a high-frequency power source and a matcher. The matcher may maximize efficiency at which high-frequency power is supplied to the first electrode E1 by reducing reflection of the high-frequency power from the first electrode E1.

The first plasma generating device 330 may generate first plasma P1 in the first space 301A by supplying a high-frequency signal of about 2 MHz to about 40 MHz, e.g., a high-frequency signal of about 13.56 MHz to the first electrode E1. The first plasma P1 may include both radicals and ions.

The first plasma P1 may be relatively uniformly distributed and flow into the second space 301B through the shower head 320. The shower head 320 may be grounded, and in this case, the shower head 320 may allow the radicals of the first plasma P1 to pass therethrough, but may hinder the passing of the ions therethrough.

As a result, only or mainly only the radicals may exist in the second space 301B. In some examples, a higher concentration of radicals is present in the second space 301B than in the first space 301A.

The second plasma generating device 340 may include a sinusoidal wave generating device 342b capable of generating a sinusoidal signal and a non-sinusoidal wave generating device 344b capable of generating a non-sinusoidal signal. Herein, the sinusoidal signal refers to a periodic signal that may be expressed as a sine and/or cosine function. The non-sinusoidal signal refers to a signal periodically repeated with a specific waveform other than a sinusoidal wave.

The sinusoidal signal and the non-sinusoidal signal may be mixed in a mixer 348 and may be supplied to the second electrode E2. In some examples, a first filter 342a may be provided to prevent the sinusoidal wave generating device 342b from being disturbed by the non-sinusoidal signal. In some examples, a second filter 344a may be provided to prevent the non-sinusoidal wave generating device 344b from being disturbed by the sinusoidal signal. Although FIG. 1 illustrates the first filter 342a and the second filter 344a as separate components, the first filter 342a and the second filter 344a may be configured as one component.

The second electrode E2 may be a susceptor dedicated to support a substrate S thereon. The substrate S may include the substrate 110, the carrier substrate 101cs, the adhesive material 101ca, the passivation layer 120, and the self-assembled monolayer 130 which have been described with reference to FIGS. 2A through 2F.

In some examples, the second electrode E2 may be provided separately from the susceptor on which the substrate S is supported. The substrate S may be, but is not specially limited to, a semiconductor substrate like a silicon wafer, or a glass substrate.

A ring-shaped cooling line and heating element extending in a circumferential direction may be provided in the susceptor.

Second plasma P2 may be generated on the second electrode E2 by the non-sinusoidal signal and the sinusoidal signal provided to the mixer 348.

The second plasma P2 may have an ion energy distribution for reforming a material layer exposed on the surface of the substrate S.

Figure 10A:
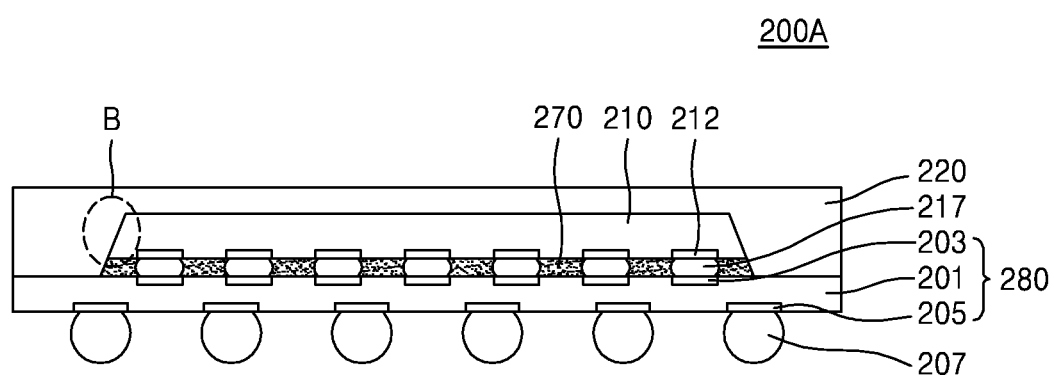
FIG. 10A is a side view of a semiconductor package including a semiconductor device produced as a result of a method according to an embodiment of the inventive concept.
Figure 10B:
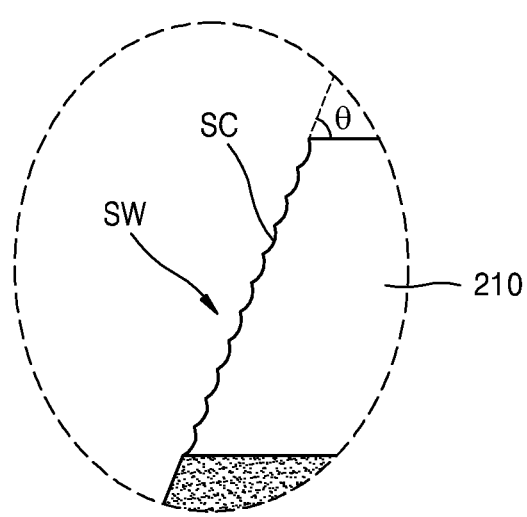
FIG. 10B is an enlarged view of portion B of the package shown in FIG. 10A.

FIG. 10A illustrates an example of a semiconductor package 200A including a cut and singulated semiconductor device 210 according to an embodiment of the inventive concept. FIG. 10B is an enlarged view of a portion B of FIG. 10A.

Referring to FIG. 10A, the semiconductor device 210 may be flip-chip mounted on a package substrate 280.

The package substrate 280 may include a base board layer 201, and a top pad 203 and a bottom pad 205 which are arranged on a top surface and a bottom surface of the base board layer 201, respectively.

In some examples, the package substrate 280 is a printed circuit board (PCB). For example, the package substrate 280 may be a multi-layer PCB.

The base board layer 201 may include at least one material selected from phenol resin, epoxy resin, and polyimide. The base board layer 201 may include at least one material selected from, for example, flame retardant 4, tetrafunctional epoxy, polyphenylene ether, epoxy/polyphenylene oxide, bismaleimide triazine (BT), Thermount, cyanate ester, polyimide, and liquid crystal polymer.

The top pad 203 and the bottom pad 205 may be formed of metal such as copper (Cu), tungsten (W), titanium (Ti), titanium tungsten (TiW), titanium nitride (TiN), tantalum (Ta), tantalum nitride (TaN), chrome (Cr), aluminum (Al), indium (In), molybdenum (Mo), manganese (Mn), cobalt (Co), tin (Sn), nickel (Ni), magnesium (Mg), rhenium (Re), beryllium (Be), gallium (Ga), or ruthenium (Ru), a metal alloy, or a metal nitride.

A top solder resist layer and a bottom solder resist layer, that expose the top pad 203 and the bottom pad 205, respectively, may be provided on the top surface and the bottom surface of the base board layer 201. A board connection member 217 is connected to the top pad 203, and an external connection terminal 207 is connected to the bottom pad 205.

The package substrate 280 may include interconnection patterns that electrically connect the top pad 203 with the bottom pad 205 and a conductive via that electrically connects the interconnection patterns. Each interconnection pattern may be located on the top surface, the bottom surface, and/or inside the base board layer 201. The interconnection pattern may include, for example, an electrolytically deposited (ED) copper foil, a rolled-annealed (RA) copper foil, a stainless-steel foil, an aluminum foil, ultra-thin copper foils, a sputtered layer of copper, or a copper alloy.

The conductive via may pass through at least a part of the base board layer 201. In some examples, the conductive via comprises copper, nickel, stainless steel, or beryllium copper.

The semiconductor device 210 may be a semiconductor device that is formed by the singulation method described with reference to FIGS. 1 through 2F. The description of other materials and elements of the semiconductor device 210 has been provided with reference to FIGS. 1 through 2F, and thus will not be repeated.

The semiconductor device 210 may include a chip pad 212 on an active surface thereof. The chip pad 212 and of the semiconductor device 210 and the top pad 203 of the package substrate 280 may be connected to each other by the board connection member 217. The board connection member 217 may include, for example, a bump, a solder ball, or a conductive pillar.

An under-fill material layer 270 surrounding the board connection member 217 may be provided between the semiconductor device 210 and the package substrate 280. The under-fill material layer 270 may comprise, for example, epoxy resin formed using a capillary underfill method. In some examples, the under-fill material layer 270 is a non-conductive film (NCF).

The semiconductor package 200A may further include a molding member 220 surrounding the semiconductor device 210. The molding member 220 may comprise, for example, epoxy molding compound (EMC). The molding member 220 may cover a top surface of the package substrate 280 and a top surface and a side surface of the semiconductor device 210.

Referring to FIG. 10B, the side surface of the semiconductor device 210 may be inclined at an inclination θ of 90 degrees or less with respect to the top surface of the semiconductor device 210. A side surface SW of the semiconductor device 210 may include multiple scallops SC.

The scallops SC and the inclination θ may be formed by performing the Bosch process as described with reference to FIGS. 8A through 8G.

Figure 11:
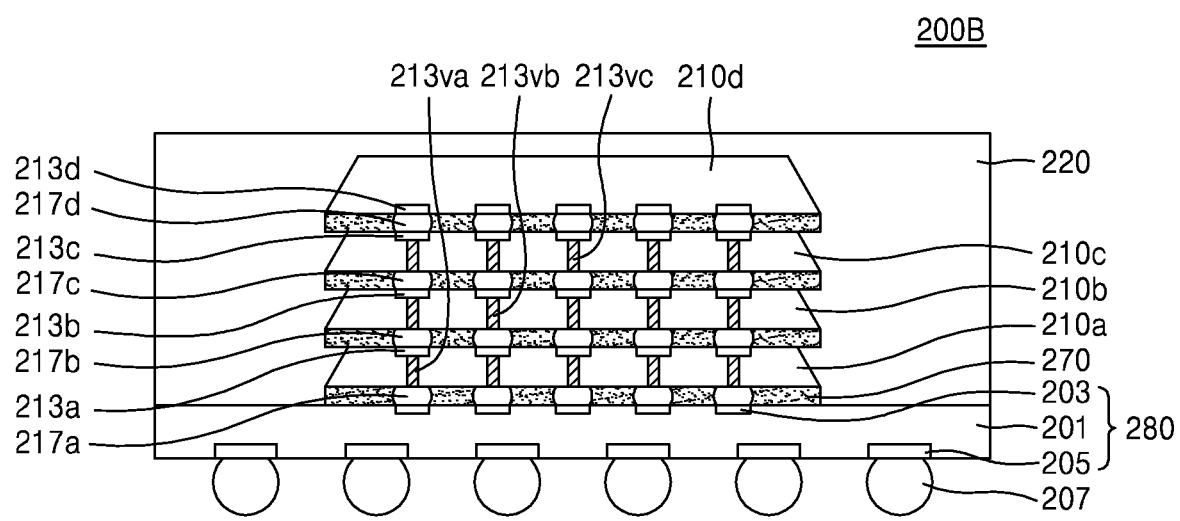
FIG. 11 is a side view of a semiconductor package including a plurality of sawn and semiconductor devices produced as a result of a method according to an embodiment of the inventive concept.

FIG. 11 illustrates an example of a semiconductor package 200B including a plurality of semiconductor devices according to an embodiment of the inventive concept.

The example described with reference to FIG. 11 is the same as the example described with reference to FIG. 10A in terms of the package substrate 280, the external connection terminal 207, the under-fill material layer 270, and the molding member 220, and thus these parts of the package will not be further described.

The semiconductor package 200B may include a first semiconductor device 210a, a second semiconductor device 210b, a third semiconductor device 210c, and a fourth semiconductor device 210d. The first semiconductor device 210a, the second semiconductor device 210b, and the third semiconductor device 210c may be of the same type. Each of the first semiconductor device 210a, the second semiconductor device 210b, and the third semiconductor device 210c may be connected to a through silicon via (TSV). The fourth semiconductor device 210d may be a semiconductor device of the type described with reference to FIG. 10A.

The first semiconductor device 210a, the second semiconductor device 210b, and the third semiconductor device 210c may include a first through via 213va, a second through via 213vb, and a third through via 213vc. The first semiconductor device 210a, the second semiconductor device 210b, the third semiconductor device 210c, and the fourth semiconductor device 210d may include a first chip pad 213a, a second chip pad 213b, a third chip pad 213c, and a fourth chip pad 213d, respectively.

The top pad 203 and the first semiconductor device 210a may be connected to each other by a first connection member 217a. The first chip pad 213a and the second semiconductor device 210b may be connected to each other by a second connection member 217b. The second chip pad 213b and the third semiconductor device 210c may be connected to each other by a third connection member 217c. The third chip pad 213c and the fourth chip pad 213d of the fourth semiconductor device 210d may be connected to each other by a fourth connection member 217d.

A side surface of at least one of the first semiconductor device 210a, the second semiconductor device 210b, the third semiconductor device 210c, and the fourth semiconductor device 210d may be inclined at an inclination of 90 degrees or less with respect to the top surface as described with reference to FIGS. 10A and 10B.

In some examples, a side surface of each of the first semiconductor device 210a, the second semiconductor device 210b, the third semiconductor device 210c, and the fourth semiconductor device 210d at inclined at an inclination of 90 degrees or less with respect to the top surface as described with reference to FIGS. 10A and 10B.

According to an aspect of the inventive concept, there are provided a method of cutting a thin substrate and method of singulating semiconductor devices which include a plasma cutting process instead of a relatively complicated photolithography process. In addition, semiconductor devices (i.e., device regions) may be separated from each other without elongating interconnections and without particles being produced as a result. Accordingly, the present inventive concept may be used to produce semiconductor products having high-reliability.

Although the inventive concept has been particularly shown and described with reference to examples thereof, the inventive concept may be put into practice in many different ways and should not be construed as being limited to the examples described above. Rather, these examples were described so that this disclosure is thorough and complete, and fully conveys the inventive concept to those skilled in the art. Thus, the true spirit and scope of the inventive concept is not limited by the examples described above but by the following claims.

What is claimed is:

1. A method of cutting a substrate having device regions and a scribe lane region separating the device regions from one another, the method comprising:
   forming a passivation layer on the substrate selectively so as to cover the device regions of the substrate but not the scribe lane region;
   forming a self-assembled monolayer over the passivation layer; and
   cutting into the scribe lane region of the substrate using a plasma.

2. The method of claim 1, wherein the self-assembled monolayer is formed on the passivation layer with a selectivity greater than 5:1 with respect to the scribe lane region.

3. The method of claim 2, wherein the self-assembled monolayer has a structure in which self-assembled molecules are packed side-by-side, and
   each of the self-assembled molecules comprises a head group, an end group, and a backbone between the head group and the end group.

4. The method of claim 3, wherein the head group comprises a thiol group (—SH), a silanol group (—SiH$_{3-x}$(OH)$_x$) wherein x is an integer from 1 to 3, a halogen, a hydroxy group (—OH), a phosphoric acid group (—PO$_4$), an alkenyl group having a carbon number of 2 to 6, a dihydroxyphenyl group (—C$_6$H$_3$(OH)$_2$), or a carboxylic acid group (—COOH).

5. The method of claim 1, wherein the forming of the passivation layer comprises forming an initial un-activated layer of passivation material, and activating the passivation material before the forming of the self-assembled monolayer.

6. The method of claim 5, wherein the activating of the passivation material comprises at least one of treating the passivation material with plasma, irradiating the passivation material ultraviolet (UV) light, exposing the passivation material to infrared radiation, and impregnating the passivation material with polyol.

7. The method of claim 1, wherein the cutting is performed by deep reactive ion etching (DRIE).

8. The method of claim 7, wherein the cutting forms in the scribe lane region a recess having scalloped sides.

9. The method of claim 7, wherein the cutting forms in the scribe lane region a recess having a V-shaped cross section.

10. The method of claim 9, wherein the cutting is preformed such that a bottom of the recess is located within the substrate between two of the device regions that are adjacent to each other, whereby after the cutting has been terminated the two device regions are not completely severed from each other by the recess but remain partially connected to each other.

11. A method of cutting a substrate having device regions and a scribe lane region separating the device regions from one another, the method comprising:
    forming a passivation layer on the substrate selectively so as to cover the device regions of the substrate but not the scribe lane region by forming an initial un-activated layer of passivation material and subsequently activating the passivation material;
    forming a self-assembled monolayer over the passivation layer; and
    forming a recess in the scribe lane region by deep reactive ion etching (DRIE), wherein the DRIE is terminated before the recess extends through the substrate such that at least a part of the scribe lane region of the substrate remains.

12. The method of claim 11, wherein the recess is formed such that sides thereof are oblique with respect to a top surface of the substrate.

13. The method of claim 11, wherein the self-assembled monolayer has a structure in which self-assembled molecules are packed side-by-side,
    each of the self-assembled molecules comprises a head group, an end group, and a backbone between the head group and the end group, and
    the backbone comprises a chain-shaped hydrocarbon.

14. The method of claim 11, wherein the forming of the self-assembled monolayer comprises dipping the substrate into a solution in which self-assembling molecules are dispersed.

* * * * *